US012587158B2

(12) United States Patent
Chi et al.

(10) Patent No.: US 12,587,158 B2
(45) Date of Patent: Mar. 24, 2026

(54) ELECTRONIC DEVICE COMPRISING FIRST AND SECOND CAPACITOR ELEMENTS EACH INCLUDING A RESPECTIVE CAPACITOR, SWITCH AND CHOKE COIL

(71) Applicant: Innolux Corporation, Miaoli County (TW)

(72) Inventors: Jen-Hai Chi, Miaoli County (TW); Chen-Lin Yeh, Miaoli County (TW); Chin-Lung Ting, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 489 days.

(21) Appl. No.: 18/172,284

(22) Filed: Feb. 21, 2023

(65) Prior Publication Data

US 2023/0299489 A1      Sep. 21, 2023

Related U.S. Application Data

(60) Provisional application No. 63/320,218, filed on Mar. 16, 2022.

(30) Foreign Application Priority Data

Nov. 29, 2022    (CN) .......................... 202211510641.2

(51) Int. Cl.
*H03H 7/12* (2006.01)
*H01F 27/28* (2006.01)
*H01Q 9/04* (2006.01)

(52) U.S. Cl.
CPC ............... *H03H 7/12* (2013.01); *H01F 27/28* (2013.01); *H01Q 9/0442* (2013.01)

(58) Field of Classification Search
CPC ...................................................... H03H 7/12
USPC ......................................................... 333/174
See application file for complete search history.

(56) References Cited

U.S. PATENT DOCUMENTS

| | | | | |
|---|---|---|---|---|
| 9,143,172 B2 | 9/2015 | See et al. | | |
| 9,520,829 B1 | 12/2016 | Kim et al. | | |
| 10,044,084 B2 * | 8/2018 | Fukasawa | ............... | H03F 3/195 |
| 2002/0149535 A1 * | 10/2002 | Toncich | ............. | G01R 27/2694 |
| | | | | 343/860 |
| 2005/0012565 A1 * | 1/2005 | Kamata et al. | ......... | H03J 5/244 |
| | | | | 333/175 |
| 2014/0292442 A1 * | 10/2014 | Basine | ..................... | H03H 7/12 |
| | | | | 333/174 |

OTHER PUBLICATIONS

"Search Report of Europe Counterpart Application", issued on Jul. 21, 2023, p. 1-p. 8.
Adel S. Sedra et al., "Microelectronic Circuits (6th edition)", Microelectronic circuits 6th edition, Dec. 15, 2009, pp. 1-7.
"Office Action of Europe Counterpart Application", issued on Dec. 15, 2025, p. 1-p. 6.

* cited by examiner

*Primary Examiner* — Benny T Lee
(74) *Attorney, Agent, or Firm* — JCIPRNET

(57) ABSTRACT
An electronic device including a tuning element is provided. The tuning element includes a first capacitor element including a first switch and a first capacitor electrically coupled to the first switch and a second capacitor element including a second capacitor. The first capacitor element is electrically connected in parallel with the second capacitor element.

16 Claims, 5 Drawing Sheets

ELECTRONIC DEVICE COMPRISING FIRST AND SECOND CAPACITOR ELEMENTS EACH INCLUDING A RESPECTIVE CAPACITOR, SWITCH AND CHOKE COIL

CROSS-REFERENCE TO RELATED APPLICATION

This application claims the priority benefit of U.S. provisional application Ser. No. 63/320,218, filed on Mar. 16, 2022, and China application serial no. 202211510641.2, filed on Nov. 29, 2022. The entirety of each of the above-mentioned patent applications is hereby incorporated by reference herein and made a part of this specification.

BACKGROUND

Technical Field

The disclosure relates to an electronic device.

Description of Related Art

A radio frequency (RF) device in an electronic device is used to transmit or receive electromagnetic waves, and thus is an integral part of the wireless communication technology. How the tuning ratio of the tuning element in the radio frequency device may be increased to increase the adjustable radio frequency parameters (such as radiation intensity, resonance frequency, or phase) is one of the focus of research and development.

SUMMARY OF THE INVENTION

The disclosure provides an electronic device, which helps to increase the tuning ratio of the tuning element.

According to an embodiment of the disclosure, the electronic device includes a tuning element. The tuning element includes a first capacitor element including a first switch and a first capacitor electrically coupled to the first switch and a second capacitor element including a second capacitor. The first capacitor element is electrically connected in parallel with the second capacitor element.

In order to make the above-mentioned features and advantages of the disclosure clearer and easier to understand, the following specific embodiments are given and described in details with the accompanying drawings as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAIL DESCRIPTION OF THE EMBODIMENTS

Figure 1:
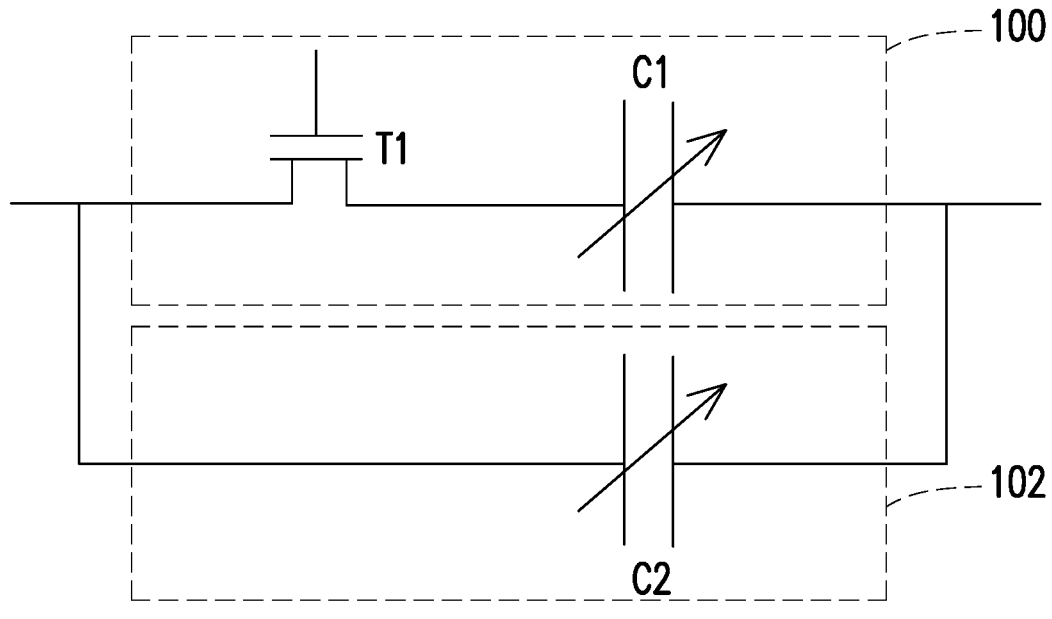
FIG. 1 to FIG. 5 are simple circuit diagrams of electronic devices according to some embodiments of the disclosure.

Reference will now be made in detail to the exemplary embodiments of the disclosure, examples of which are illustrated in the accompanying drawings. Wherever possible, the same reference numbers are used in the drawings and the detail description to refer to the same or similar parts.

Throughout the specification and the appended claims of the disclosure, certain terms are used to refer to specific elements. It should be understood by persons skilled in the art that electronic device manufacturers may refer to the same element by different names. The disclosure does not intend to distinguish between elements with the same function but different names. In the following specification and claims, words such as "containing" and "comprising" are open-ended words, so the words should be interpreted as "including but not limited to . . . ".

Directional terms, such as "upper", "lower", "front", "rear", "left", "right", mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, these drawings should not be construed to define or limit the scope or nature covered by the embodiments. For example, the relative sizes, thicknesses, and positions of various layers, regions, and/or structures may be reduced or enlarged for clarity.

A structure (or layer, element, substrate) described in the disclosure is located on/over another structure (or layer, element, substrate), which may mean that the two structures are adjacent and directly connected, or that the two structures are adjacent but not directly connected. Indirect connection means that there is at least one intermediate structure (or intermediate layer, intermediate element, intermediate substrate, intermediate space) between the two structures, and a lower surface of one structure is adjacent to or directly connected to an upper surface of the intermediate structure, while an upper surface of the other structure is adjacent to or directly connected to a lower surface of the intermediate structure. The intermediary structure may be composed of a single-layer or multi-layer physical structure or a non-physical structure and is without limitation. In the disclosure, when a certain structure is set "on" other structures, it may mean that the structure is "directly" on the other structures, or that the structure is "indirectly" on the other structures, that is, at least one structure being also interposed between the structure and the other structures.

The terms "about", "equal to", "equivalent" or "same", "substantially" or "roughly" are generally interpreted as being within 20% of a given value or range, or interpreted as within 10%, 5%, 3%, 2%, 1%, or 0.5% of a value or range. In addition, the term "a given range is from a first value to a second value" or "a given range is within a range from a first value to a second value" mean that the given range includes the first value, the second value, and other values in between.

The ordinal number used in the specification and the claims such as "first" or "second" is used to modify elements, and the ordinal numbers do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and the specification may not use the same terms, whereby a first member in the specification may be a second member in the claims.

The electrical connection or coupling described in this disclosure may refer to direct connection or indirect connection. In the case of direct electrical connection, endpoints of elements on two circuits are directly connected or connected to each other by a conductor segment, while in the case of indirect electrical connection, there is a switch, a diode, a capacitor, an inductor, a resistor, other suitable elements, or a combination of the above elements between the endpoints of the elements on the two circuits, but not limited thereto.

In this disclosure, the measurement manner of thickness, length, and width may adopt an optical microscope (OM), and the thickness or the width may be measured by a cross-sectional image in an electron microscope, but is not limited thereto. In addition, there may be a certain error between any two values or directions for comparison. In addition, the terms "about", "equal to", "equivalent" or "same", "substantially" or "roughly" are generally interpreted as being within 20% of a given value or range, or interpreted as within 10%, 5%, 3%, 2%, 1%, or 0.5% of a value or range. In addition, the term "a given range is from a first value to a second value" or "a given range is within a range from a first value to a second value" mean that the given range includes the first value, the second value, and other values in between. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

It should be noted that in the following embodiments, the features of several different embodiments may be replaced, recombined, and mixed to complete other embodiments without departing from the spirit of the disclosure. As long as the features of the embodiments do not violate the spirit of the disclosure or conflict with each other, the features may be arbitrarily mixed and matched for use.

Unless otherwise defined, all terms (including technical and scientific terms) used herein have the same meaning as commonly understood by persons skilled in the art to which the disclosure belongs. It may be understood that these terms, such as the terms defined in commonly used dictionaries, should be interpreted as having meanings consistent with the relevant art and the background or the context of the disclosure, and should not be interpreted in an idealized or overly formal manner, unless otherwise defined in the embodiments of the disclosure.

An electronic device of the disclosure may include, for example, a display device, a backlight device, a radio frequency device, a sensing device, or a splicing device, but is not limited thereto. The electronic device may be a bendable or flexible electronic device. The display device may be a non-self-illuminating display device or a self-illuminating display device. The electronic device may include, for example, a liquid crystal, a light emitting diode, a fluorescence, a phosphor, a quantum dot (QD), other suitable display media, or a combination of the above. The radio frequency device may include a frequency selective surface (FSS), a radio frequency filter (RF-Filter), a polarizer, a resonator, or an antenna. The antenna may be a liquid crystal type antenna or a non-liquid crystal type antenna. The sensing device may be a sensing device for sensing capacitance, light, heat, or ultrasonic, but is not limited thereto. In the disclosure, an electronic device may include an electronic element, and the electronic element may include a passive element and an active element, such as capacitors, resistors, inductors, diodes, or transistors. The diode may include a light emitting diode or a photodiode. The light emitting diode may include, for example, an organic light emitting diode (OLED), a submillimeter light emitting diode (mini LED), a micro light emitting diode (micro LED), or a quantum dot light emitting diode (quantum dot LED), but is not limited thereto. The splicing device may be, for example, a display splicing device or a radio frequency splicing device, but is not limited thereto.

It should be noted that the electronic device may be any permutation and combination of the above, but is not limited thereto. In addition, the shape of the electronic device may be rectangular, circular, polygonal, a shape with curved edges, or other suitable shapes. The electronic device may have a peripheral system such as a driving system, a control system, and a light source system to support the display device, the radio frequency device, the wearable device (such as including the augmented reality or the virtual reality), the vehicle-mounted device (such as including the car windshield), or the splicing device.

FIG. 1 to FIG. 5 are simple circuit diagrams of electronic devices according to some embodiments of the disclosure. It should be noted that the technical solutions provided in the different embodiments below may be replaced, combined, or mixed with each other to form another embodiment without violating the spirit of the disclosure.

Referring to FIG. 1, an electronic device 1 includes a tuning element 10. The tuning element 10 may include an active element, a passive element, or a combination of the above, such as a capacitor, a resistor, an inductor, a diode, a transistor, an MEMS or a combination of the above. The relevant parameters of the tuning element 10 may be tuned by a signal applied to the tuning element 10. The relevant parameters may include a dielectric constant, an area, a semiconductor depletion region width, a metal plate height, etc., but are not limited thereto. In some embodiments, the tuning element 10 may be packaged in a panel level package (PLP), a wafer level package (WLP), a fan-out wafer level package (FOWLP), or other technologies for packaging the tuning element. In some embodiments, the tuning element 10 may be bonded to a corresponding one or multiple conductive patterns (not shown) and/or signal lines (not shown) of the electronic device 1 by means of a direct bonding, a micro-bonding, or a flip-chip bonding. In some embodiments, the tuning element may be a chip integrating an active element, a passive element, or a combination of the above, such as a capacitor, a resistor, an inductor, a diode, a transistor, a micro-electromechanical system, or a combination of the above, and the tuning element 10 may be bonded to a substrate (not shown) having redistributed signal lines or conductive patterns in the electronic device 1 by means of a direct bonding, a micro-bonding, or a flip-chip bonding.

In some embodiments, the tuning element 10 may be used to tune a radio frequency wave or an electromagnetic wave. For example, the tuning element 10 may include a capacitor element. The capacitor element may include a variable capacitor or a constant capacitor, but is not limited thereto. The variable capacitor may be formed by a liquid crystal device, a varactor diode, or a micro electro mechanical system (MEMS), etc., but is not limited thereto. By changing the voltage applied to the tuning element 10 through the conductive pattern and the signal line, the equivalent capacitance of the tuning element 10 may be controlled, so that the phase and amplitude of the electromagnetic wave change accordingly, thereby controlling the direction the electromagnetic wave or improving the directivity of the radio frequency device. By increasing the tuning ratio of the tuning element 10, the adjustable radio frequency parameters (such as radiation intensity, resonance frequency, or phase) or the radiation direction of the adjustable electromagnetic wave may be increased.

Taking FIG. 1 as an example, the tuning element 10 may include a first capacitor element 100 and a second capacitor element 102. The first capacitor element 100 includes a first switch T1 and a first capacitor C1 electrically coupled to the first switch T1. The second capacitor element 102 includes a second capacitor C2. The first capacitor element 100 is electrically connected in parallel with the second capacitor element 102.

In the disclosure, the end of one element is connected to the end of the other element to form a single contact (or referred to as a node), which is referred to as the electrical coupling of the two elements. On the other hand, when the two ends of the element are respectively connected to the two ends of the other element to form two nodes, the two elements are referred to as being electrically connected in parallel.

In some embodiments, the switches (including the first switch T1) in the tuning element 10 may include a transistor. The kinds of transistor are not limited. For example, the transistor may include a bipolar junction transistor (BJT), a field effect transistor (FET), a metal oxide semiconductor field effect transistor (MOSFET), a thin-film transistor (TFT), a high electron mobility transistor (HEMT), a junction field effect transistor (JFET), an insulated gate bipolar transistor (IGBT), a nano field effect transistor (nano FET), an ion sensitive field effect transistor (ISFET), a tunnel field effect transistor (TFET), an organic field-effect transistor (OFET), or a combination of the above, but is not limited thereto.

In some embodiments, the capacitors in the tuning element 10 (including the first capacitor C1 and the second capacitor C2) may include variable capacitors or constant capacitors. In other words, the capacitance of the capacitor in the tuning element 10 may be variable or constant. When the tuning element 10 includes multiple capacitors, the multiple capacitors may include multiple variable capacitors, multiple constant capacitors, or a combination of the above. The capacitance ranges of the multiple variable capacitors may be the same or different. In addition, the capacitances of the multiple constant capacitors may be the same or different.

Taking FIG. 1 as an example, the first capacitor C1 and the second capacitor C2 are, for example, variable capacitors. The capacitance range of the first capacitor C1 is, for example, Cmin1 to Cmax1, and the capacitance range of the second capacitor C2 is, for example, Cmin2 to Cmax2. Cmin1 and Cmin2 may be the same or different, and Cmax1 and Cmax2 may be the same or different. In other embodiments, at least one of the first capacitor C1 and the second capacitor C2 is a variable capacitor. Alternatively, at least one of the first capacitor C1 and the second capacitor C2 is a constant capacitor. That is, at least one of the first capacitor C1 and the second capacitor C2 has a constant value.

The tuning ratio of the tuning element is defined as the maximum capacitance of the tuning element divided by the minimum capacitance of the tuning element. If the tuning element is composed of a single variable capacitor, and the maximum capacitance and the minimum capacitance of the variable capacitor are respectively Cmax and Cmin, then the tuning ratio of the tuning element is Cmax divided by Cmin. If the tuning element is composed of two variable capacitors electrically connected in parallel, and the maximum capacitance and the minimum capacitance of each variable capacitor are respectively Cmax and Cmin, then the maximum capacitance and the minimum capacitance of the tuning element are 2*Cmax and 2*Cmin, so the tuning ratio of the tuning element is still Cmax divided by Cmin.

Under the framework of FIG. 1, for the convenience of explanation, it is assumed that Cmin1=Cmin2=Cmin and Cmax1=Cmax2=Cmax, and the tuning element 10 has a maximum capacitance of 2*Cmax when the first switch T1 is turned on (open circuit), and the tuning element 10 has a minimum capacitance Cmin when the first switch T1 is turned off (open circuit). Therefore, the tuning ratio of the tuning element 10 is 2*Cmax divided by Cmin, which is twice as much the tuning ratio of the tuning element composed of a single variable capacitor or the tuning element composed of the two variable capacitors electrically connected in parallel. In other words, through the structure of FIG. 1, the tuning ratio of the tuning element may be effectively improved, which in turn helps to increase the adjustable radio frequency parameters (such as radiation intensity, resonance frequency, or phase) or increase the radiation direction of the adjustable electromagnetic wave.

In addition, the quality factor of the tuning element is inversely proportional to the product of the resistance and capacitance of the tuning element. When the resistance of the first switch T1 is negligibly small, the tuning element 10 may maintain the same or similar quality factor as the aforementioned tuning element (such as a tuning element composed of a single variable capacitor or a tuning element composed of two variable capacitors electrically connected in parallel). For example, if the switch and the capacitor in the tuning element 10 are fabricated on the same substrate, the main material of the switch in the tuning element 10 may include silicon, gallium nitride, gallium arsenide, silicon carbide, or a combination of the above. Based on the consideration of high-frequency use requirements or quality factors, the main material of the switch may be gallium nitride, gallium arsenide, silicon carbide, or a combination of the above. On the other hand, the switch and capacitor in the tuning element 10 may be fabricated on different substrates, and the main material of the switch in the tuning element 10 may include silicon, gallium nitride, gallium arsenide, silicon carbide, glass, or a combination of the above.

Figure 2:
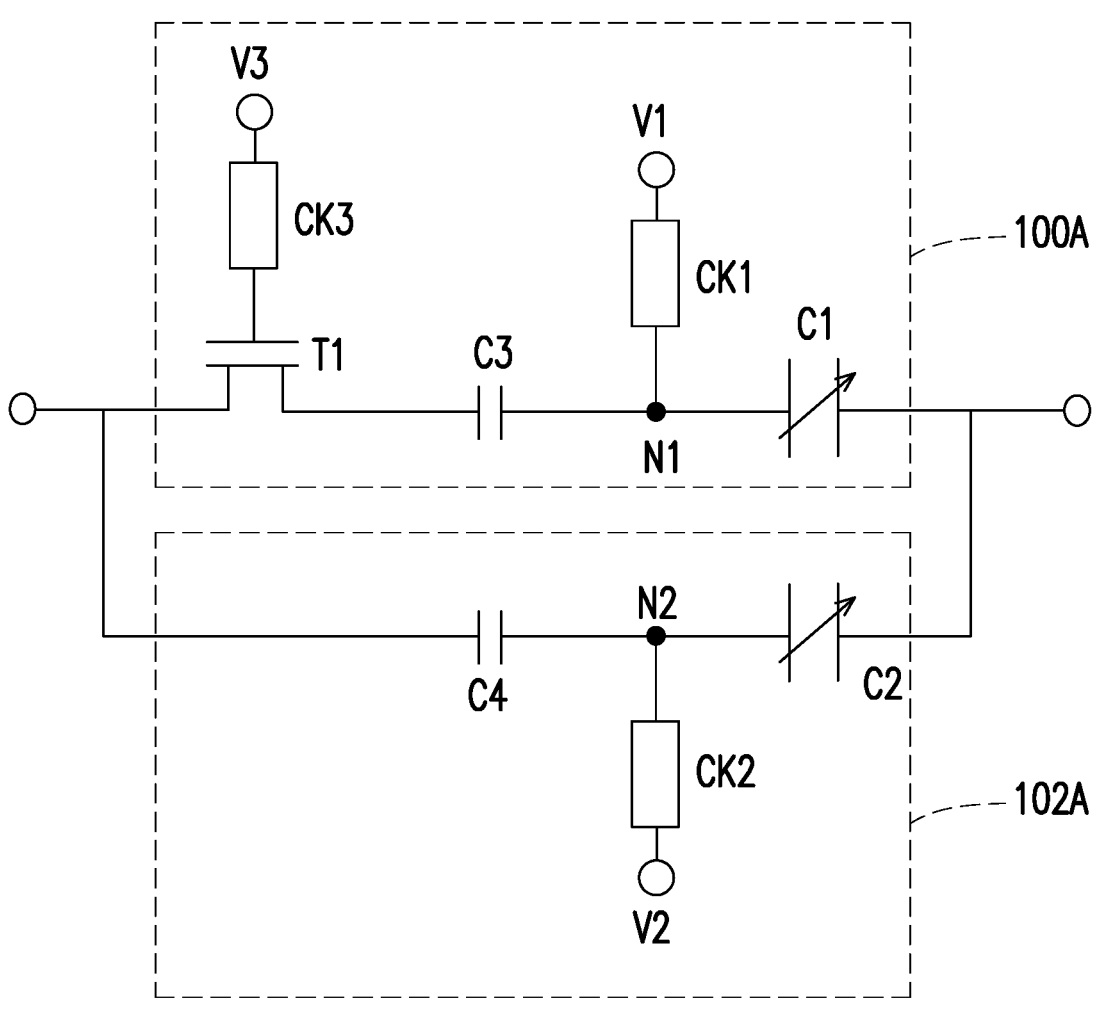

Referring to FIG. 2, an electronic device 1A includes a tuning element 10A, and the tuning element 10A includes a first capacitor element 100A and a second capacitor element 102A. The first capacitor element 100A may further include a first choke coil CK1, a third capacitor C3, and a third choke coil CK3, in addition to the first switch T1 and the first capacitor C1. The second capacitor element 102A may further include a second choke coil CK2 and a fourth capacitor C4, in addition to the second capacitor C2.

The first choke coil CK1 is electrically connected to a first node N1 between the first switch T1 and the first capacitor C1. For example, opposite ends of the first choke coil CK1 are respectively connected to the first node N1 and a first DC signal source V1. The first choke coil CK1 is used, for example, to separate the transmission path of the radio frequency wave (or electromagnetic wave) from the DC signal or block the radio frequency wave (or electromagnetic wave) from being transmitted upward to the first DC signal source V1. In some embodiments, the first choke coil CK1 may be selected from a resistor, a bypass capacitor, a transmission line, or a combination thereof, but is not limited thereto. For example, the first choke coil CK1 may be a resistor to consume the radio frequency wave (or electromagnetic wave). Alternatively, the first choke coil CK1 may be an inductor with a bypass capacitor, and the inductor is connected between the first node N1 and the first DC signal source V1, and the bypass capacitor is connected between the node (not shown) which is between the inductor and the first DC signal source V1 and the ground wire. Alternatively, the first choke coil CK1 may be a quarter wavelength transmission line with a bypass capacitor, and the quarter wavelength transmission line is connected between the first node N1 and the first DC signal source V1, and the bypass capacitor is connected between the node which is between the quarter wavelength transmission line and the first DC signal source V1 (not shown shown) and the ground wire.

The third capacitor C3 is electrically connected between the first switch T1 and the first capacitor C1. For example, opposite ends of the third capacitor C3 are respectively connected to the first node N1 and the first switch T1. The third capacitor C3 is, for example, used to block the DC signal from being transmitted to the first switch T1 to the left. In some embodiments, the third capacitor C3 is a constant capacitor, but is not limited thereto.

The third choke coil CK3 is electrically coupled to the first switch T1, and the first switch T1 is located between the first node N1 and the third choke coil CK3. For example, opposite ends of the third choke coil CK3 are respectively connected to the first switch T1 and a third DC signal source V3. The third choke coil CK3 is used, for example, to block the radio frequency wave (or electromagnetic wave) from being transmitted upwards to the third DC signal source V3. In some embodiments, the third choke coil CK3 may be selected from a resistor, a bypass capacitor, a transmission line, or a combination thereof, but is not limited thereto. For example, the third choke coil CK3 may be a resistor to consume the radio frequency wave (or electromagnetic wave). Alternatively, the third choke coil CK3 may be an inductor with a bypass capacitor, and the inductor is connected between the first switch T1 and the third DC signal source V3, and the bypass capacitor is connected between the node (not shown) which is between the inductor and the third DC signal source V3 and the ground wire. Alternatively, the third choke coil CK3 may be a quarter wavelength transmission line with a bypass capacitor, and the quarter wavelength transmission line is connected between the first switch T1 and the third DC signal source V3, and the bypass capacitor is connected between the node (not shown) which is between the quarter wavelength transmission line and the third DC signal source V3) and the ground wire.

The second choke coil CK2 is electrically coupled to the second capacitor C2. For example, the second choke coil CK2 is electrically connected to a second node N2 between the fourth capacitor C4 and the second capacitor C2, and opposite ends of the second choke coil CK2 are respectively connected to the second node N2 and a second DC signal source V2. The second choke coil CK2 is used, for example, to separate the transmission path of the radio frequency wave (or electromagnetic wave) from the DC signal or block the radio frequency wave (or electromagnetic wave) from being transmitted downward to the second DC signal source V2. In some embodiments, the second choke coil CK2 may be selected from a resistor, a bypass capacitor, a transmission line, or a combination thereof, but is not limited thereto. For example, the second choke coil CK2 may be a resistor to consume the radio frequency wave (or the electromagnetic wave). Alternatively, the second choke coil CK2 may be an inductor with a bypass capacitor, and the inductor is connected between the second node N2 and the second DC signal source V2, and the bypass capacitor is connected between the node (not shown) which is between the inductor and the second DC signal source V2 and the ground wire.

Alternatively, the second choke coil CK2 may be a quarter wavelength transmission line with a bypass capacitor, and the quarter wavelength transmission line is connected between the second node N2 and the second DC signal source V2, and the bypass capacitor is connected to the node (not shown) which is between the quarter wavelength transmission line and the second DC signal source V2) and the ground wire.

The fourth capacitor C4 is electrically coupled to the second capacitor C2, and the second node N2 is located between the fourth capacitor C4 and the second capacitor C2. The fourth capacitor C4 is, for example, used to block the transmission of the DC signal to the left. In some embodiments, the fourth capacitor C4 is a constant capacitor, but is not limited thereto.

Figure 3:
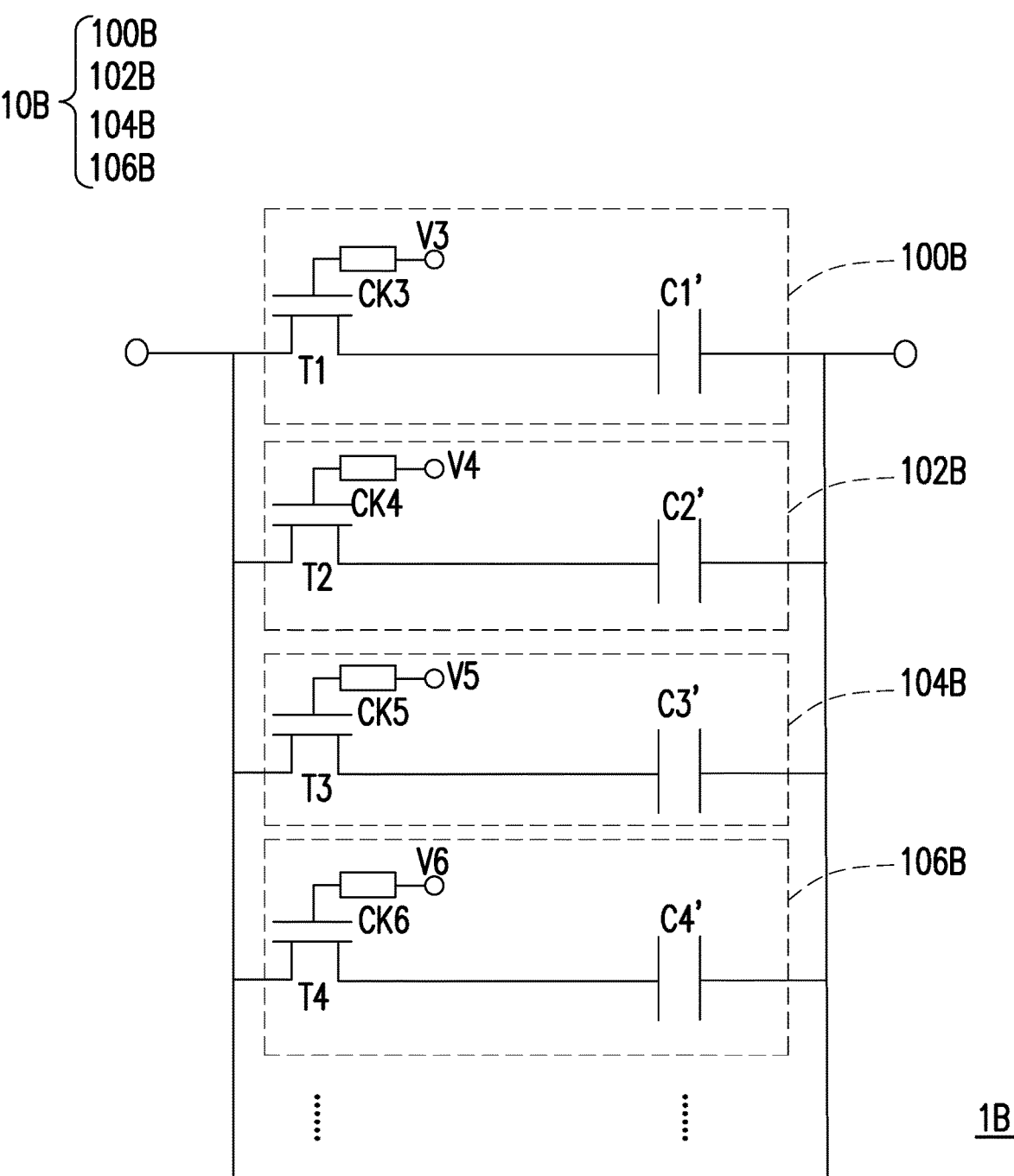

Referring to FIG. 3, an electronic device 1B includes a tuning element 10B, and the tuning element 10B includes multiple capacitor elements, such as a first capacitor element 10013, a second capacitor element 102B, a third capacitor element 104B, and a fourth capacitor element 106B, but is not limited thereto. In other embodiments, although not shown, the tuning element 10B may include more or less capacitor elements.

In the electronic device 1B, for example, the multiple capacitor elements have the same or similar compositions. For example, each capacitor element may include a switch, a capacitor, and a choke coil, and the capacitance in each capacitor element is, for example, a constant capacitance, but is not limited thereto.

In detail, in FIG. 3, the first capacitor element 100B includes, for example, the first switch T1, a first capacitor C1', and the third choke coil CK3, and the first capacitor C1' is a constant capacitor. The relative arrangement relationship of the first switch T1, the first capacitor C1', and the third choke coil CK may be referred to the above, and are not be repeated here.

The second capacitor element 102B includes, for example, a second switch T2, a second capacitor C2', and a fourth choke coil CK4, and the second capacitor C2' is a constant capacitor. The second switch T2 is electrically coupled to the second capacitor C2'. The fourth choke coil CK4 is electrically coupled to the second switch T2, and the relative arrangement relationship between the fourth choke coil CK4 and the second switch T2 is similar to the relative arrangement relationship between the third choke coil CK3 and the first switch T1. For the details of the fourth choke coil CK4, reference may be made to the relevant description of the third choke coil CK3, and so are repeated here.

The third capacitor element 104B includes, for example, a third switch T3, a third capacitor C3', and a fifth choke coil CK5, and the third capacitor C3' is a constant capacitor. The third switch T3 is electrically coupled to the third capacitor C3'. The fifth choke coil CK5 is electrically coupled to the third switch T3, and the relative arrangement relationship between the fifth choke coil CK5 and the third switch T3 is similar to the relative arrangement relationship between the third choke coil CK3 and the first switch T1. For the details of the fifth choke coil CK5, reference may be made to the relevant description of the third choke coil CK3, and so are not repeated here.

The fourth capacitor element 106B includes, for example, a fourth switch T4, a fourth capacitor C4', and a sixth choke coil CK6, and the fourth capacitor C4' is a constant capacitor. The fourth switch T4 is electrically coupled to the fourth capacitor C4'. The sixth choke coil CK6 is electrically coupled to the fourth switch T4, and the relative arrangement relationship between the sixth choke coil CK6 and the fourth switch T4 is similar to the relative arrangement relationship between the third choke coil CK3 and the first switch T1. For the details of the sixth choke coil CK6, reference may be made to the relevant description of the third choke coil CK3, and so are not repeated here. In some embodiments, the first capacitor C1', the second capacitor C2', the third capacitor C3', and the fourth capacitor C4' may all be constant capacitors, variable capacitors, or a combination of constant capacitors and variable capacitors.

In FIG. 3, the first capacitor C1', the second capacitor C2', the third capacitor C3', and the fourth capacitor C4' may have the same capacitance or different capacitances. In addition, the third choke coil CK3, the fourth choke coil CK4, the fifth choke coil CK5, and the sixth choke coil CK6 may be respectively connected to different DC signal sources, such as the third DC signal source V3, a fourth DC signal source V4, a fifth DC signal source V5, and a sixth DC signal source V6, and the DC signal sources may be controlled independently.

By independently controlling the on and off states of the multiple switches (such as the first switch T1, the second switch T2, the third switch T3, and the fourth switch T4) in the multiple capacitor elements (such as the first capacitor element 100B, the second capacitor element 102B, the third capacitor element 104B, and the fourth capacitor element 106B), the equivalent capacitance of the tuning element 10B may be controlled, and the tuning element 10B is, for example, a digital capacitor element.

Figure 4:
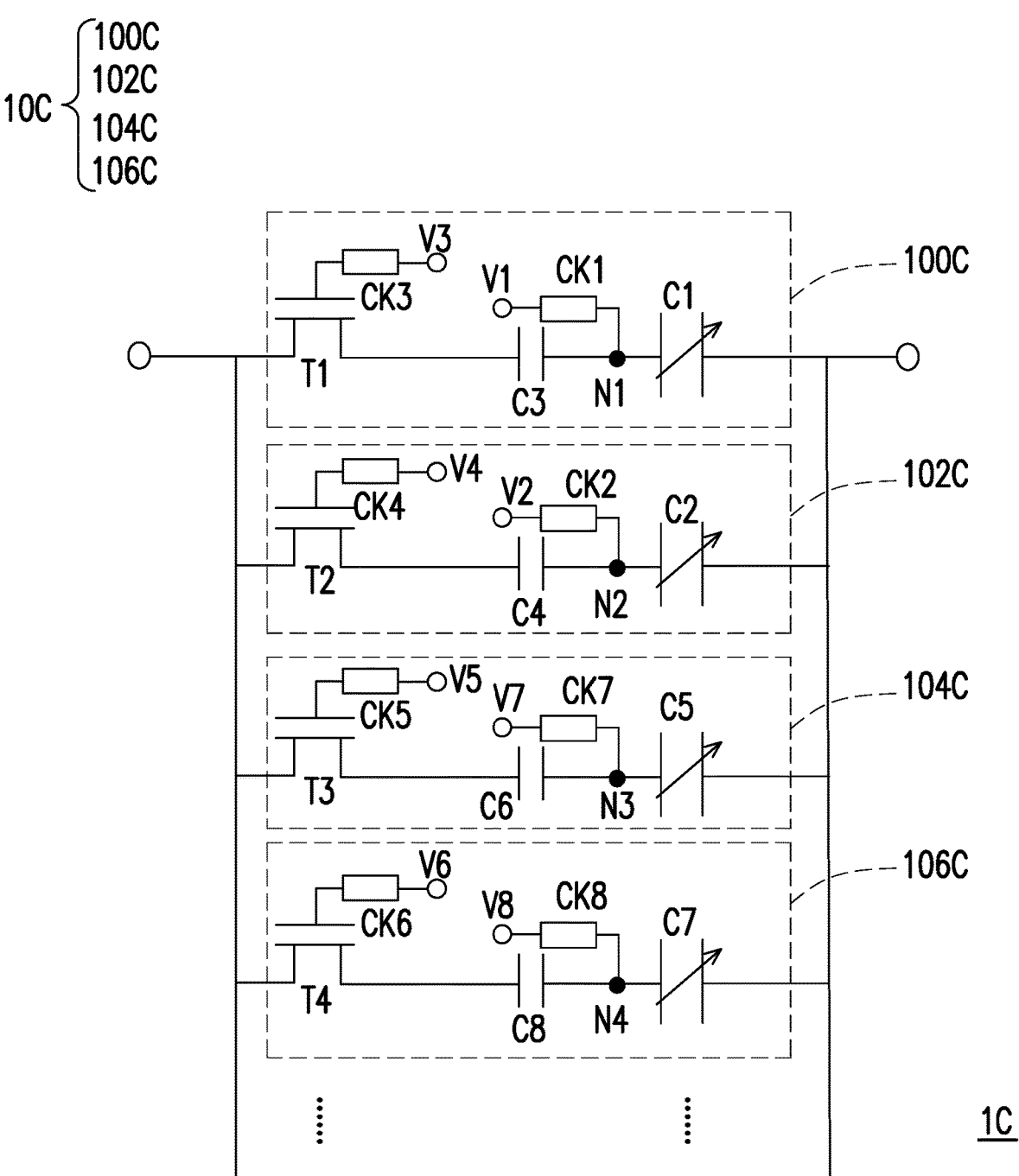
Figure 5:
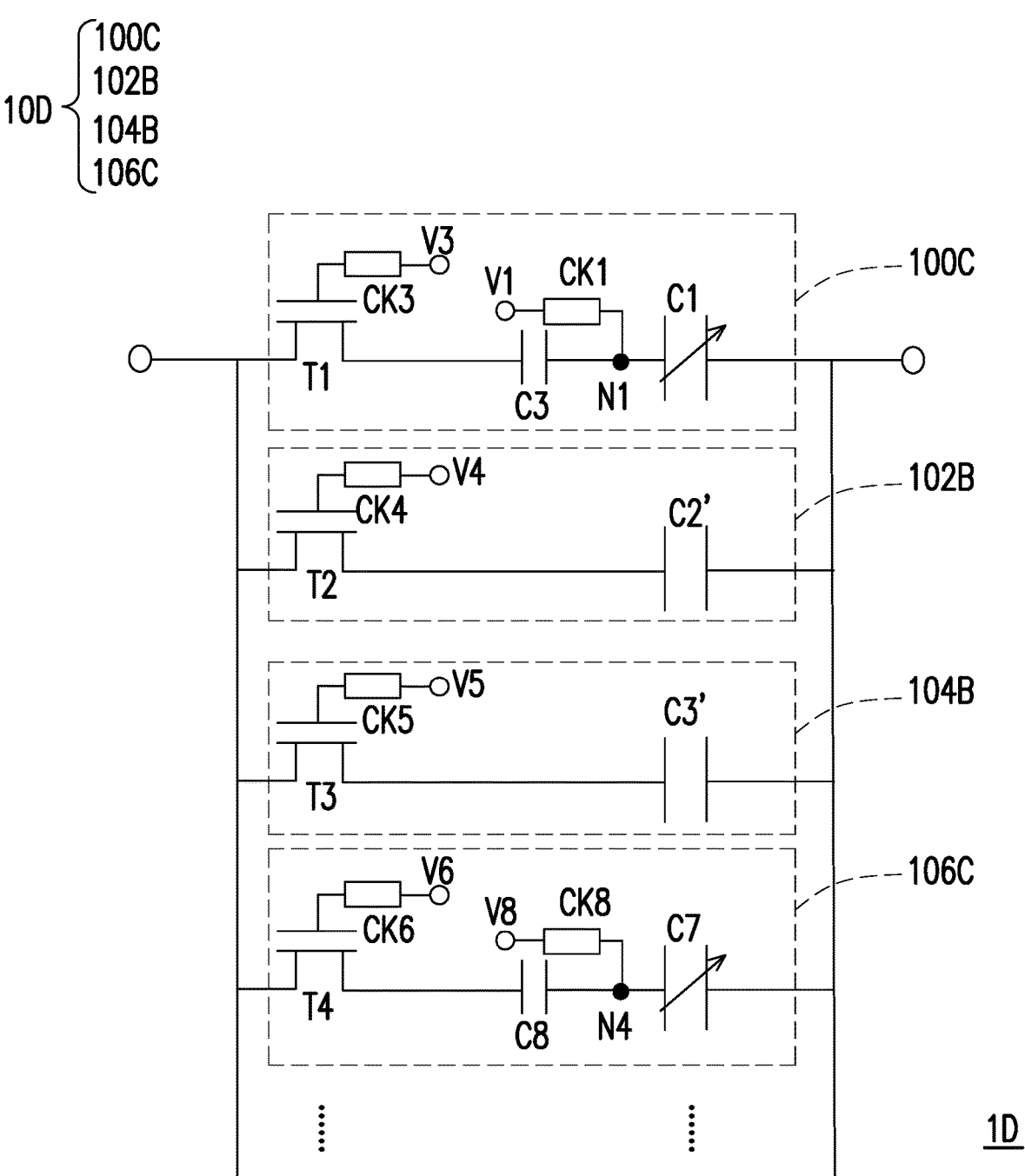

Referring to FIG. 4, an electronic device 1C includes a tuning element 10C, and the tuning element 10C includes multiple capacitor elements, such as a first capacitor element 100C, a second capacitor element 102C, a third capacitor element 104C, and a fourth capacitor element 106C, but is not limited thereto. In other embodiments, although not shown, the tuning element 10C may include more or less capacitor elements.

In the electronic device 1B, for example, the multiple capacitor elements have the same or similar compositions. For example, each capacitor element may include a switch, two capacitors and two choke coils, and the two capacitors in each capacitor element may be, for example, variable capacitors and constant capacitors, but are not limited thereto.

In detail, in FIG. 4, the first capacitor element 100C includes, for example, the first switch T1, the first capacitor C1, the first choke coil CK1, the third capacitor C3, and the third choke coil CK3, and the first capacitor C1 is a variable capacitor, and the third capacitor C3 is a constant capacitor. For the relative arrangement relationship of the above elements, please refer to the foregoing, and repetitions are not made here.

The second capacitor element 102C includes, for example, the second switch T2, the second capacitor C2, the second choke coil CK2, the fourth capacitor C4, and the fourth choke coil CK4, and the second capacitor C2 is a variable capacitor, and the fourth capacitor C4 is a constant capacitor. The second switch T2 is electrically coupled to the second capacitor C2. The second choke coil CK2 is electrically connected to the second node N2 which is between the second switch T2 and the second capacitor C2, and the second choke coil CK2 is electrically connected between the second node N2 and the second DC signal source V2. The fourth capacitor C4 is located between the second switch T2 and the second node N2. The fourth choke coil CK4 is electrically connected between the second switch T2 and the fourth DC signal source V4.

The third capacitor element 104C includes, for example, the third switch T3, a fifth capacitor C5, a seventh choke coil CK7, a sixth capacitor C6, and the fifth choke coil CK5, and the fifth capacitor C5 is a variable capacitor, and the sixth capacitor C6 is a constant capacitor.

The third switch T3 is electrically coupled to the fifth capacitor C5. The seventh choke coil CK7 is electrically connected to a third node N3 between the third switch T3 and the fifth capacitor C5, and the seventh choke coil CK7 is electrically connected between the third node N3 and a seventh DC signal source V7. The sixth capacitor C6 is located between the third switch T3 and the third node N3. The fifth choke coil CK5 is electrically connected between the third switch T3 and the fifth DC signal source V5. For the details of the seventh choke coil CK7, the sixth capacitor C6, and the fifth choke coil CK5, please refer to the relevant descriptions of the first choke coil CK1, the third capacitor C3, and the third choke coil CK3, and repetitions are not made here.

The fourth capacitor element 106C includes, for example, the fourth switch T4, a seventh capacitor C7, an eighth choke coil CK8, an eighth capacitor C8, and the sixth choke coil CK6, and the seventh capacitor C7 is a variable capacitor, and the eighth capacitor C8 is a constant capacitor. The fourth switch T4 is electrically coupled to the seventh capacitor C7. The eighth choke coil CK8 is electrically connected to a fourth node N4 between the fourth switch T4 and the seventh capacitor C7, and the eighth choke coil CK8 is electrically connected between the fourth node N4 and an eighth DC signal source V8. The eighth capacitor C8 is located between the fourth switch T4 and the fourth node N4. The sixth choke coil CK6 is electrically connected between the fourth switch T4 and the sixth DC signal source V6. For details of the eighth choke coil CK8, the eighth capacitor C8, and the sixth choke coil CK6, please refer to the relevant descriptions of the first choke coil CK1, the third capacitor C3, and the third choke coil CK3, and repetitions are not made here.

In FIG. 4, the capacitance ranges of the multiple variable capacitors (such as the first capacitor C1, the second capacitor C2, the fifth capacitor C5, and the seventh capacitor C7) may be the same or different. In addition, the capacitances of the multiple constant capacitors (such as the third capacitor C3, the fourth capacitor C4, the sixth capacitor C6, and the eighth capacitor C8) may be the same or different. In addition, the multiple DC signal sources (including the first DC signal source V1 to the eighth DC signal source V8) may be independently controlled.

In other embodiments, at least one of the multiple variable capacitors may be replaced with the constant capacitor, and when the variable capacitor is replaced with the constant capacitor, the choke coil and the constant capacitor electrically coupled with the variable capacitor may be omitted before the replacement. For example, at least one capacitor element (such as the first capacitor element 100C, the second capacitor element 102C, the third capacitor element 104C, and/or the fourth capacitor element 106C) in FIG. 4 may be replaced by at least one capacitor element in FIG. 3 (such as the first capacitor element 100B, the second capacitor element 102B, the third capacitor element 104B, and/or the fourth capacitor element 106B). Taking FIG. 5 as an example, a tuning element 10D of an electronic device 1D includes, for example, the first capacitor element 100C in FIG. 4, the second capacitor element 102B in FIG. 3, the third capacitor element 104B in FIG. 3, and the fourth capacitor element 106C in FIG. 4, but is not limited thereto.

In other embodiments, although not shown, the tuning element 10D may include more or less capacitor elements.

To sum up, in the embodiment of the disclosure, the tuning ratio of the tuning element may be effectively improved through the design of the multiple capacitor elements being electrically connected in parallel and at least one capacitor element including the switch and the capacitor, thereby helping to increase the adjustable radio frequency parameters (such as radiation intensity, resonance frequency, or phase) or the radiation direction of the adjustable electromagnetic wave.

The above embodiments are only used to illustrate, but not to limit, the technical solution of the disclosure. Although the disclosure has been described in detail with reference to the above embodiments, persons skilled in the art should understand that the technical solutions described in the above embodiments may still be modified or some or all of the technical features thereof may be equivalently replaced. However, these modifications or replacements do not cause the essence of the corresponding technical solutions depart from the scope of the technical solutions of the embodiments of the disclosure.

Although the embodiments of the disclosure and the advantages thereof have been disclosed above, it should be understood that any person skilled in the art may make changes, substitutions, and modifications without departing from the spirit and scope of the disclosure, and the features of each embodiment may be arbitrarily mixed and replaced with each other to form other new embodiments. In addition, the protection scope of the disclosure is not limited to the processes, machines, manufactures, material compositions, devices, methods, and steps in the specific embodiments described in the specification, and any person skilled in the art may learn from the content of the disclosure the current or future developed processes, machines, manufactures, material compositions, devices, methods, and steps which may be used according to the disclosure as long as they may perform substantially the same function or obtain substantially the same results in the embodiments described herein. Therefore, the protection scope of the disclosure includes the above processes, machines, manufactures, material compositions, devices, methods, and steps. In addition, each claim constitutes an individual embodiment, and the protection scope of the disclosure also includes combinations of the individual claims and the embodiments. The protection scope of the disclosure shall be defined by the appended claims.

What is claimed is:

1. An electronic device, comprising:
a tuning element, comprising:
a first capacitor element comprising:
  a first switch;
  a first capacitor, electrically coupled to the first switch; and
  a choke coil, electrically connected to the first switch, wherein the first switch is located between the choke coil and the first capacitor; and
a second capacitor element, comprising a second capacitor, a second switch and another choke coil, wherein the second switch is electrically coupled to the second capacitor, the another choke coil is electrically connected to the second switch,
wherein the first capacitor element is electrically connected in parallel with the second capacitor element,
wherein respective capacitances of the first capacitor and the second capacitor are constant, and wherein the second switch is located between the another choke coil and the second capacitor.

2. The electronic device according to claim 1, wherein the first capacitor element further comprises:
a first choke coil, electrically connected to a first node between the first switch and the first capacitor, wherein the second capacitor element further comprises:
a second choke coil, electrically coupled to the second capacitor.

3. The electronic device according to claim 2, wherein the second choke coil is electrically connected to a second node between the second switch and the second capacitor.

4. The electronic device according to claim 2, wherein the first capacitor element further comprises:
a third choke coil, electrically coupled to the first switch, wherein the first switch is located between the first node and the third choke coil.

5. The electronic device according to claim 1, wherein the choke coil and the another choke coil are respectively connected to different DC signal sources.

6. The electronic device according to claim 1, wherein the first switch includes a first transistor, and the second switch includes a second transistor, the choke coil is electrically connected to a gate electrode of the first transistor, and the another choke coil is electrically connected to a gate electrode of the second transistors.

7. The electronic device according to claim 1, wherein a capacitance of at least one of the first capacitor and the second capacitor is constant.

8. The electronic device according to claim 1, wherein the tuning element tunes a radio frequency wave.

9. The electronic device according to claim 1, wherein at least one of the first capacitor and the second capacitor is a variable capacitor.

10. The electronic device according to claim 9, wherein the first capacitor element further comprises:
a third capacitor, electrically connected between the first switch and the first capacitor.

11. The electronic device according to claim 10, wherein the first capacitor is a variable capacitor, a capacitance of the second capacitor is constant, and the first capacitor element further comprises:
a first choke coil, electrically connected to a first node between the third capacitor and the first capacitor; and
a third choke coil, electrically coupled to the first switch, wherein the first switch is located between the third capacitor and the third choke coil, and the second capacitor element further comprises:
a fourth choke coil, electrically coupled to the second switch, wherein the second switch is located between the second capacitor and the fourth choke coil.

12. The electronic device according to claim 11, wherein the first choke coil, the third choke coil, and the fourth choke coil are respectively connected to different DC signal sources.

13. The electronic device according to claim 10, wherein a capacitance of the third capacitor is constant.

14. The electronic device according to claim 10, wherein the second capacitor element further comprises:
a fourth capacitor, electrically coupled to the second capacitor.

15. The electronic device according to claim 14, wherein a capacitance of the fourth capacitor is constant.

16. The electronic device according to claim 14, wherein the second capacitor element further comprises:

a second choke coil, electrically connected to a second node between the fourth capacitor and the second capacitor.

* * * * *